United States Patent [19]
Ikeda

[11] Patent Number: 6,033,479
[45] Date of Patent: Mar. 7, 2000

[54] PROCESS GAS DELIVERY SYSTEM FOR CVD HAVING A CLEANING SUBSYSTEM

[75] Inventor: Towl Ikeda, Chiba, Japan

[73] Assignee: Applied Materials, Inc., Santa Clara, Calif.

[21] Appl. No.: 09/064,401

[22] Filed: Apr. 22, 1998

[51] Int. Cl.[7] ...................................................... B08B 9/02
[52] U.S. Cl. .................. 118/688; 118/715; 118/726; 134/22.1; 134/22.11; 134/22.12
[58] Field of Search ................... 118/715, 726, 118/688; 0/22.1, 22.11, 22.12

[56] References Cited

U.S. PATENT DOCUMENTS

| | | |
|---|---|---|
| 4,393,013 | 7/1983 | McMenamin . |
| 4,529,474 | 7/1985 | Fujiyama et al. ........................ 134/1 X |
| 4,553,431 | 11/1985 | Nicolai . |
| 5,294,262 | 3/1994 | Nishimura ............................... 134/22.1 |
| 5,535,624 | 7/1996 | Lehmann . |
| 5,630,878 | 5/1997 | Miyamoto et al. ...................... 118/715 |
| 5,683,537 | 11/1997 | Ishii . |
| 5,690,743 | 11/1997 | Murakami et al. ...................... 118/715 |
| 5,730,804 | 3/1998 | Gomi et al. ........................ 134/22.12 X |
| 5,760,294 | 6/1998 | Lehmann . |

FOREIGN PATENT DOCUMENTS

| | | |
|---|---|---|
| 0286158 | 3/1988 | European Pat. Off. . |
| 0460511 | 5/1991 | European Pat. Off. . |
| 0666340 | 2/1995 | European Pat. Off. . |
| 3206130 | 2/1983 | Germany . |
| 3929506 | 9/1989 | Germany . |
| 0689038 | 6/1995 | Germany . |
| 60-212908 | 9/1985 | Japan . |
| 2111518 | 4/1990 | Japan . |

OTHER PUBLICATIONS

U.S. application No. 08/870,961 (Atty Dkt. 1688/PVD/DV).
U.S. application No. 08/928,371 (Atty. Dkt. 2041/PVD/DV).
U.S. application No. 08/922,510 (Atty. Dkt. 2036/PVD/DV).
Search Report from Yoshida Kanayama Ishida & Associates dated Jul. 9, 1997.

*Primary Examiner*—Milton Cano
*Attorney, Agent, or Firm*—Charles S. Guenzer

[57] ABSTRACT

A process gas delivery system incorporating a cleaning solution delivery subsystem for chemical vapor deposition. The system includes a slanted cleaning solution feed pipe for introducing a cleaning solution into the process gas delivery system and for disposal of waste cleaning solution from the process gas delivery system. Automatic determination of maintenance time may be accomplished by using an optical sensor provided on the process gas delivery pipe that detects the accumulation of the deposition material within the piping. The sensor may also be used to detect the cleaning solution residue inside the piping after cleaning and the liquid level during deposition.

34 Claims, 1 Drawing Sheet

PROCESS GAS DELIVERY SYSTEM FOR CVD HAVING A CLEANING SUBSYSTEM

FIELD OF THE INVENTION

The present invention relates to gas delivery systems for semiconductor fabrication processes, and more particularly, to a process gas delivery system incorporating a cleaning solution delivery subsystem.

BACKGROUND OF THE INVENTION

Chemical vapor deposition (CVD) processes are commonly used for depositing a thin film on a substrate. A CVD processing system typically includes a vacuum chamber into which the substrate is placed. A gaseous precursor is introduced into the chamber and the thin film is formed as a result of reactions or decomposition of the gaseous precursor at the surface of the substrate. A carrier gas may be used to carry the precursor into the process chamber. Devices for vaporizing liquid or solid deposition precursor materials are known in the art. One such device used to vaporize a liquid precursor is commonly referred to as a "bubbler," an example of which is schematically shown in FIG. 1. Bubblers may be employed in CVD systems using a liquid precursor such as DMAH, TDMAT, TEOS, etc. The bubbler includes a container 12 having a quantity of liquid precursor 14 therein. A carrier gas is introduced from a gas source (not shown) into the container 12 through a conduit or sparger pipe 16 having an opening 18 below the surface of the liquid precursor 14 in the container 12. The opening 18 is usually at a point near the bottom of the container 12. Upon being introduced into the liquid precursor 14, the carrier gas forms discrete bubbles 20, after exiting the liquid precursor 14, which rise to the surface. Each bubble 20 will contain a quantity of the precursor in vapor form. The carrier gas containing the deposition precursor vapor is collected in the bubbler in the space 22 above the level of the liquid precursor 14, and is delivered from the bubbler through an outlet pipe 24 to the process chamber (not shown). The pipes 16 and 24 typically have a diameter of ¼ inch.

Due to its physical and chemical properties, the gaseous deposition precursor material may be prematurely deposited on the inner walls of the delivery piping. Such deposition of material on the piping walls may cause clogging, contamination and have other harmful effects on the gas delivery and deposition process. As a result, the portion of the delivery system through which the vaporized deposition material flows requires cleaning from time to time. Methods for removing material deposited on the piping walls have been developed. Such methods include the application of a gas or liquid to the piping walls to etch or dissolve away the accumulated material. While the gas delivery systems having cleaning subsystems have been utilized, it would be desirable to increase the efficiency of the cleaning delivery subsystem so improve the overall process throughput.

SUMMARY OF THE INVENTION

It is an object of the present invention to provide an improved cleaning solution delivery subsystem for a process gas delivery system for metal-organic chemical vapor deposition (MOCVD) that facilitates the disposal of waste cleaning solution after pipe cleaning. It is another object of the present invention to provide automatic determination of the appropriate maintenance time for the process gas delivery system. It is yet another object of the present invention to provide a process gas delivery system having increased pipe cleaning efficiency.

These and other objects and advantages are achieved by embodiments of the present invention, which include an apparatus for delivering a process gas to a process chamber for chemical vapor deposition. The apparatus includes a process gas generator for supplying the process gas and a process gas delivery conduit connected to the process gas generator through a first valve for delivering the process gas to the process chamber. A cleaning solution supply may be injected into the process gas delivery conduit through a feed conduit having first and second ends and a second valve between the first and second ends. The first end of the feed conduit is connected to the cleaning solution supply and the second end of the feed conduit is connected to the process gas delivery conduit at a position close to the first valve. The feed conduit is slanted so that the first end is at a higher elevation than the second end. The process gas delivery conduit also has a disposal port for removing the cleaning solution.

Embodiments also include a gas distribution system including a carrier gas source and a container housing a liquid deposition precursor material from which a process gas is formed. A first conduit is provided for carrying the carrier gas to the container. The first conduit includes an open end located in the container and positioned within the liquid deposition precursor material. A second conduit is provided for carrying process gas to the process chamber, the second conduit connected to the container and positioned to receive the carrier gas and the process gas after the carrier gas has flowed through the liquid deposition precursor material. A first valve is located between the container chamber and the process chamber and a second valve is located between the carrier gas supply and the container. A cleaning solution supply and cleaning solution conduit are provided for supplying cleaning solution to the process gas delivery conduit through a feed conduit having first and second ends and a third valve between the first and second ends. The first end of the feed conduit is connected to the first conduit and the second end of the feed conduit is connected to the second conduit. The feed conduit is slanted so that the first end is at a higher elevation than the second end. The second conduit includes a disposal port for removing the cleaning solution from the second conduit.

Embodiments also relate to process gas delivery and cleaning methods. One embodiment includes a method for cleaning a process gas delivery system for a chemical vapor deposition system, the process gas delivery system including a process gas generator and a process gas delivery conduit connected to the process gas generator through a first valve for delivering the process gas to a process chamber. A cleaning solution is introduced to the process gas delivery conduit through a feed conduit having first and second end portions. The second end portion is connected to the process gas delivery conduit at a position adjacent to the first valve. The second end portion is positioned to have a lower elevation than the first end portion so that liquid in the feed conduit may flow by the force of gravity from the first end portion to the second end portion. The method also includes removing the cleaning solution from the process gas delivery conduit through a disposal conduit.

Other embodiments include a method for cleaning a process gas delivery system having a carrier gas supply conduit and a process gas delivery conduit. The method includes providing a gas supply conduit leading into a bubbler, the bubbler containing a deposition precursor material. A process gas delivery conduit leading from the bubbler to a process chamber is also provided, and a cleaning fluid is supplied through a feed conduit having a first end attached to the carrier conduit and a second end attached to the process gas delivery conduit. The feed conduit is positioned so that the first end is at a higher elevation than the second end.

Still other embodiments include a method for controlling the cleaning cycle in a process gas delivery system. The method includes providing a carrier gas supply conduit leading into a bubbler and a process gas delivery conduit leading from the bubbler to a process chamber. A supply of cleaning fluid is provided. The cleaning fluid may be fed through a feed conduit having a first end attached to a carrier conduit and a second end attached to a process gas delivery conduit. The first end of the feed conduit is positioned at a higher elevation than the second end. An amount of material accumulated within the process gas delivery conduit is measured using a sensor located along the process gas delivery conduit and cleaning fluid is automatically supplied to the feed conduit when the amount of material accumulated within the process gas delivery conduit reaches a sufficient level.

DETAILED DESCRIPTION OF THE EMBODIMENTS

The present inventors have observed that to enhance the efficiency of a process gas delivery system certain design features should be avoided and other design features should be incorporated into the system. For example, if the system is designed with horizontal conduits, waste cleaning solution may remain in the conduits after cleaning operations. As a result, certain conduits should not be oriented horizontally. In addition, it is difficult to predict the appropriate time for system cleaning so a visual inspection may be carried out in order to determine the extent to which materials have accumulated on the inner walls of the conduits. After cleaning another visual observation may be carried out to determine the amount (if any) of the cleaning solution or other reside remaining inside of the piping. These visual steps are slow and contribute to inefficiencies in the overall process. Accordingly, some sort of automated system for predicting the appropriate time to perform cleaning steps should be incorporated into the system.

Figure 1:
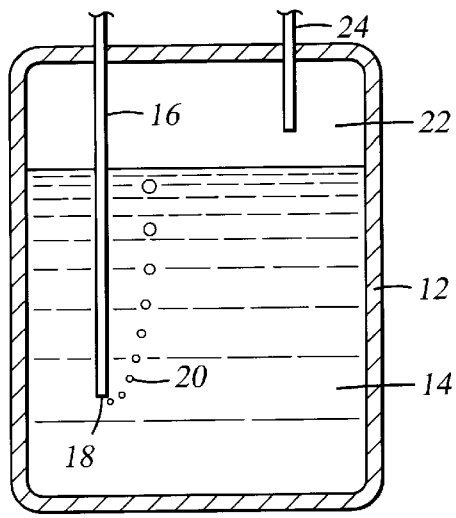
FIG. 1 is a schematic diagram of a conventional bubbler arrangement.
Figure 2:
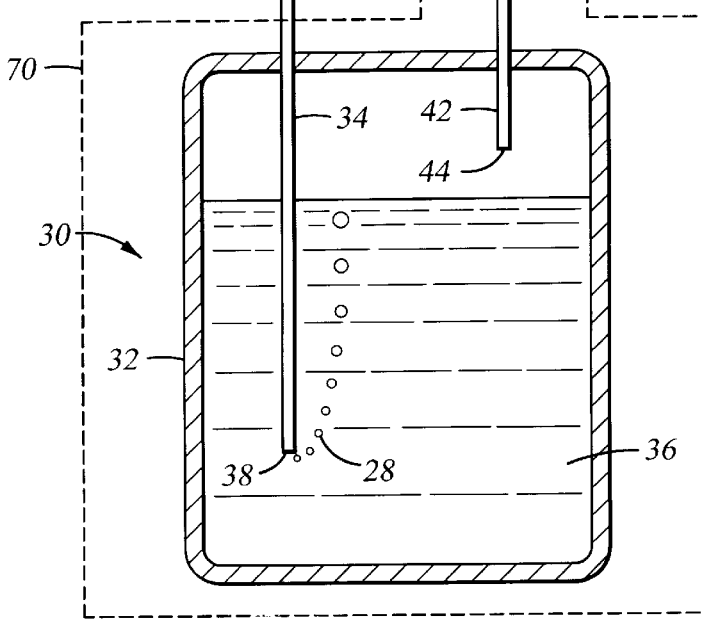
FIG. 2 is a schematic diagram of a process gas delivery system having a cleaning solution delivery subsystem according to an embodiment of the present invention.

Embodiments of the present invention relate to gas delivery systems that provide for more efficient system cleaning. Pipes (conduits) and valves are used for distributing process gases and a cleaning material through a gas distribution system. Referring to FIG. 2, a process gas delivery system according to a preferred embodiment of the present invention includes a bubbler 30 including a container 32 for containing a liquid precursor 36. Sparger pipe 34 has at least one opening 38 under the surface of the liquid precursor 36 for introducing a carrier gas 40 into the bubbler 30. The carrier gas forms discrete bubbles 28 which contain a quantity of the precursor in vapor form and which rise to the surface of the liquid precursor 36. Outlet pipe 42 includes an opening 44 above the surface of the liquid precursor 36 in the bubbler 30 for delivering the carrier gas 40 containing the vaporized precursor to the CVD system. A carrier gas supply pipe 46 is connected to the sparger pipe 34 of the bubbler through a primary sparging valve 51, and a process gas delivery pipe 54 is connected to the outlet pipe 42 of the bubbler through a primary delivery valve 53. The carrier gas supply pipe 46 is coupled to a carrier gas 40 through a carrier valve 55. Preferably carrier valve 55 (and other valves described herein) are pneumatic in operation, but other types of valves could also be used.

As illustrated in FIG. 2, portions of the sparger pipe 34, the outlet pipe 42, pipe portion 52 and pipe portion 54 are substantially vertically positioned. A cleaning solution delivery pipe 56 having a cleaning valve 57 is connected to pipe portion 52 at a position immediately downstream from a secondary delivering valve 59 for introducing a cleaning solution 60 into the gas delivery system. A slanted cross-feed pipe 62 is connected to pipe portion 52 at a position above the primary delivery valve 51. The slanted cross-feed pipe 62 is connected to processing gas delivery pipe portion 54 at a position above the primary delivery valve 53. The cross-feed pipe 62 is slanted in a direction such that its connection position with carrier gas supply pipe portion 52 is higher than its connection position with the process gas delivery pipe portion 54. The feed pipe 62 is slanted to inhibit the accumulation of waster cleaning solution in the feed pipe 62. A cross valve 63 is provided for opening and closing slanted cross-feed pipe 62.

Certain bubbler components such as the container 32 may be removably connected to the delivery system so that the container 32 can be uncoupled from the rest of the system if desired (for example, when it is necessary to replace the container 32). Depending on the valve and conduit set up, the container 32, the sparger pipe 34 (or a portion thereof), and outlet pipe 42 (or a portion thereof) may be removed from the rest of the system. A disposal pipe 66 having a cross valve 67 is connected to the process gas delivery pipe 64 at a position after valve 65.

During deposition operations, the cleaning valve, cross valve, 63 and disposal 67 may be closed and the carrier valve, 55, the secondary sparging valve 59, the primary sparging valve 51, the primary delivery valve 53 and the secondary delivery valve 65 may be open. The carrier gas 40 is introduced into the bubbler 30 through conduits 46, 52 and 34, and the carrier gas 40 containing vaporized deposition material in the bubbler 30 is delivered to the process chamber 76 through pipes 42, 54 and 64. During pipe cleaning operations, the carrier valve 55, the primary sparging valve 51 and the primary delivery valve 53 may be closed and the cleaning valve 57, the secondary sparging valve 59, the cross valve 63 and the second delivery valve 65 may be open. A cleaning solution 60 is introduced into the system through pipe 56, and enters pipe 54 through the slant pipe 62. The cleaning solution 60 may be stirred just prior to running it through the system because the action of stirring the solution may increase its cleaning efficiency as it flows through the pipes. The cleaning solution 60 may be removed from the system at a variety of locations, including through the disposal pipe 66 by a pump (not shown) connected thereto, and may be collected for reuse, recycle or disposal. Alternatively, the container 32 may be uncoupled from the system and the primary delivery valve 53 may be opened so that the cleaning solution may flow through the outlet pipe 42 and through the opening 44. The slanted orientation of the cross-feed pipe 62 is designed to facilitate the transport and disposal of the waste cleaning solution. Any cleaning solution residue remaining in the pipes may also be vaporized by heating and may be removed from the system by the pump connected to the disposal pipe 66.

In certain preferred embodiments, the sparger pipe 34 and the outlet pipe 42 of the bubbler 30 have a smaller diameter than other pipes in the system. Pipes having a ¼ inch (6 mm) diameter have previously been used for uniformity purposes because ¼ inch is the typical diameter of the sparger and outlet pipes of the bubbler. The present inventor has found that ¼ inch does not afford efficient pipe cleaning because the cleaning solution cannot efficiently dissolve and mix with the material deposited on the inner wall of the piping. It also does not afford fast and efficient disposal and vaporization of the cleaning solution residue after pipe cleaning. Using a larger diameter pipe, such as, for example, ½ inch (12 mm), enhances pipe cleaning by facilitating the dissolving and mixing of the deposited material on the piping walls. It also facilitates disposal of the waste cleaning solution after pipe cleaning, as the increased diameter enhances vaporization of the cleaning solution residue inside the pipes. Certain embodiments may include sparger and outlet pipes having a relatively small diameters of, for example, ¼ inch within the container 30. The pipe portion 52 above the feed pipe 62, the feed pipe 62, the outlet pipe portion 54 above the feed pipe 62 may all have a diameter larger than ¼ inch, such as, for example, ½ inch. The changes in pipe diameter may in certain embodiments occur at the connections to the container 32, at the connections to valves 51 and 53, or at the connections to feed pipe 62.

Portion of the gas delivery system may be maintained at an elevated temperature to facilitate the vaporization of the precursor and to maintain the process gas in vapor form during transportation to the deposition chamber. As illustrated in FIG. 2, the heated portion of the process gas delivery system is indicated by the dotted line 70, and may include the container 32, a portion of pipe 34 and pipes 42, 54 and 64. Certain preferred embodiments utilize a temperature in the range of approximately 25° C.–80° C. The elevated temperature may also serve to facilitate vaporization of the waste cleaning solution after pipe cleaning.

In another aspect of gas delivery systems, it is often difficult to predict the appropriate time for system cleaning. A visual inspection may be carried out in order to determine the extent to which materials have accumulated on the inner walls of the conduits. After cleaning another visual observation may be carried out to determine the amount of the cleaning solution or other reside remaining inside of the piping. These visual steps are slow and contribute to inefficiencies in the overall process. To address this problem, certain embodiments of the present invention provide a sensor 72 on or along the process gas delivery pipe 54 at a position above (and downstream from) the secondary delivery valve 53 and the connection position with the slant pipe 62.

In preferred embodiments the sensor 72 may comprise an optical sensor having a transparent window provided on the process gas delivery pipe 54 for passing a light beam through the interior of the pipe, a light source 73 adjacent the window for emitting the light beam, and a light detector 75 adjacent to the window at the opposite side of the pipe from the light source for detecting the light beam. The sensor 72 detects the content of the pipe by measuring the intensity of the transmitted light beam through the window. The sensor 72 may be used to detect the amount of accumulated deposition material on the window, as such deposited material tends to absorb and/or scatter the light beam. Because the deposition material passing through the piping may be deposited on the piping wall and the window in a similar manner, the amount of material deposited on the window can provide an indication of the amount of material deposited on the inner walls of process gas delivery pipe 54. This enables automatic determination of maintenance time when, for example, the detected transmitted light intensity equals a predetermined value which indicates a sufficient build-up of material on the walls so that cleaning is necessary. Thus cleaning at the optimal time can be carried out, without the need to stop the process and visually inspect the interior of the pipe. The sensor 72 may also be used during and after pipe cleaning operations to detect any the presence of any cleaning solution or other residue remaining inside the process gas delivery pipe. In addition, the sensor 72 may be used during deposition operations to measure the passage of process gas through the system.

It will, of course, be understood that modifications of the present invention, in its various aspects, will be apparent to those skilled in the art. Other embodiments are also possible, their specific designs depending upon the particular application. For example, although a bubbler is described for generating a vapor of the process gas, other devices may be used to supply such a vapor, with or without a carrier gas. Further, the cleaning solution may be directly introduced into the process gas delivery pipe 54 through a slanted feed pipe without passing through the carrier gas supply pipe 52. While certain preferred embodiments of the present invention may be used in metal oxide CVD processing systems, embodiments may also be used with other types of processing systems. Therefore, the scope of the invention should not be limited by the particular embodiments herein described but should be defined by the appended claims and equivalents thereto.

What is claimed is:

1. An apparatus for delivering a process gas to a process chamber for chemical vapor deposition, comprising:

a carrier gas generator for supplying a carrier gas;

a carrier gas delivery conduit connected to the said carrier gas generator through a first valve for delivering said carrier gas into a container containing a precursor liquid;

a cleaning solution supply for supplying a cleaning solution to said carrier gas delivery conduit;

a process gas delivery conduit extending from said container into a process chamber for delivering said process gas from said container to said process chamber;

a first feed conduit having first and second ends and a second valve therebetween for introducing said cleaning solution into said carrier gas delivery conduit, said first end being connected to said cleaning solution supply and said second end being connected to said carrier gas delivery conduit at a position close to said first valve; and a second feed conduit having first and second ends and a third valve therebetween, said first end thereof being connected to said carrier gas delivery conduit and said second end thereof being connected to said process gas delivery conduit said second feed conduit being slanted so that said first end thereof is at a higher elevation than said second end thereof;

wherein said process gas delivery conduit has a disposal port for removing said cleaning solution from said process gas delivery conduit.

2. The apparatus of claim 1, further comprising:

a bubbler for generating a vapor of said process gas carried by said carrier gas, said bubbler comprising said container for containing a liquefied form of said process gas as said precursor liquid, a sparger conduit connected to said carrier gas supply through a fourth valve, and an outlet conduit for delivering said vapor carried by said carrier gas to said process gas delivery conduit through a fifth valve.

3. The apparatus of claim 2, wherein said bubbler, said outlet conduit and said process gas delivery conduit are maintained at an elevated temperature.

4. The apparatus of claim 3, wherein said elevated temperature is in the range of approximately 25° C.–80° C.

5. The apparatus of claim 1, further comprising a sensor mounted on said process gas delivery conduit and operable to detect an amount of a material deposited on inner walls of said process gas delivery conduit, said sensor comprising a transparent window on said process gas delivery conduit, a light source and a light detector.

6. The apparatus of claim 5, wherein said sensor is further operable to detect an amount of said cleaning solution inside said process gas delivery conduit.

7. The apparatus of claim 5, wherein said sensor is further operable to detect an amount of said vapor of said process gas inside said process gas delivery conduit.

8. A process gas delivery system as in claim 1, wherein said cleaning solution vaporizes at a temperature experienced in a path between said carrier gas delivery conduit and said disposal port.

9. A gas distribution system comprising:
a carrier gas source;
a container housing a liquid deposition precursor material from which a process gas is formed, said liquid deposition precursor material filling a portion of said container;
a first conduit for carrying said carrier gas to said container, said first conduit having an open end in said container, said open end being positioned within said liquid deposition precursor material in said container;
a second conduit for carrying said process gas to a process chamber, said second conduit connected to said container and positioned to receive said carrier gas and said process gas after said carrier gas has flowed through said liquid deposition precursor material;
a first valve disposed between said container and said process chamber;
a second valve disposed between said carrier gas supply and said container;
a cleaning solution supply;
a cleaning solution conduit for supplying cleaning solution to said first conduit; and
a feed conduit having first and second ends and a third valve between said first and second ends for transporting said cleaning solution from said first conduit to said second conduit, said first end being connected to said first conduit and said second end being connected to said second conduit.

10. A gas distribution system as in claim 9, further comprising a disposal port connected to said second conduit for removing said cleaning solution from said second conduit.

11. A gas distribution system as in claim 10, wherein said feed conduit has a diameter greater than the diameter of said first conduit within said container.

12. A gas distribution system as in claim 10, further comprising a pump attached to said disposal port for pumping said cleaning solution from said second conduit.

13. A gas distribution system as in claim 9, wherein said second conduit includes a first portion having a first diameter and a second portion having a second diameter, said second diameter greater than said first diameter.

14. A gas distribution system as in claim 9, wherein said first conduit includes a first portion having a first diameter and a second portion having a second diameter, said first diameter greater than said second diameter.

15. A gas distribution system as in claim 9, wherein:
said first conduit includes a first region in said container and a second region spaced a first distance away from said container;
said second conduit includes a third region in said container and a fourth region spaced a second distance away from said container;
said first region has a smaller diameter than said second region; and
said third region has a smaller diameter than said fourth region.

16. A gas distribution system as in claim 9, wherein said feed conduit is slanted so that said first end is at a higher elevation than said second end.

17. A gas distribution system as in claim 16, further comprising a sensor disposed along said second conduit for detecting an amount of material accumulated within said second conduit.

18. A gas distribution system as in claim 17, wherein said feed conduit is slanted so that said first end is at a higher elevation than said second end.

19. A process gas delivery system comprising:
a bubbler for producing a deposition gas;
first conduit means for delivering a carrier gas to said bubbler;
second conduit means for delivering a process gas including said carrier gas and said deposition gas to a process chamber; and
third conduit means for delivering a cleaning fluid from said first conduit means to said second conduit means, said third conduit means connected to said first conduit means and said second conduit means, said third conduit means attached to said first conduit means at a position having a higher elevation than the position where said third conduit means is attached to said second conduit means.

20. A process gas delivery system as in claim 19, further comprising sensor means for determining an amount of material within said second conduit means.

21. A method for cleaning a process gas delivery system for a chemical vapor deposition system, said process gas delivery system comprising a carrier gas generator, a carrier delivery conduit connected to said carrier gas generator through a first valve extending into a container containing a precursor liquid for delivering said carrier gas to said container, a cleaning solution supply for supplying a cleaning solution to said process gas delivery conduit, a process gas delivery conduit extending from said container into a process chamber for delivering process gas to said process chamber, a feed conduit having first and second ends and a second valve therebetween for introducing said cleaning solution into said carrier gas delivery conduit, said first end thereof being connected to said cleaning solution supply and said second end thereof being connected to said carrier gas delivery conduit at a position close to said first valve, and a second feed conduit having first and second ends, said first end being connected to said carrier gas delivery conduit and said second end being connected to said process gas delivery conduit, the method comprising the steps of:
introducing said cleaning solution to said carrier gas delivery conduit, said second feed conduit and said process delivery conduit through said first feed conduit, said second end of said second feed conduit having a lower elevation than said first end so that liquid in said second feed conduit can flow by the force of gravity from said first end to said second end thereof; and removing said cleaning solution from said process gas delivery conduit through a disposal conduit connected to said process gas delivery conduit.

22. The method of claim 21, further comprising the step of detecting an amount of material deposited within a conduit in said process gas delivery system using a sensor.

23. The method of claim 22, wherein said sensor is an optical sensor comprising a transparent window provided on said process gas delivery conduit, a light source and a light detector.

24. The method of claim 23, further comprising the step of detecting an amount of said cleaning solution inside said process gas delivery conduit using said sensor.

25. The method of claim 23, further comprising the step of detecting an amount of said process gas inside said process gas delivery conduit using said sensor.

26. The method of claim 22, further comprising the step of comparing said detected amount of deposited material to a predetermined value and automatically determing whether said step of supplying a cleaning solution is to be performed based upon said comparison.

27. A method for cleaning a process gas delivery system having a carrier gas supply conduit and a process gas delivery conduit, comprising the steps of:
    providing a carrier gas supply conduit leading into a bubbler, said bubbler containing a deposition precursor material;
    providing a process gas delivery conduit leading from said bubbler to a process chamber; and
    supplying a cleaning fluid through a feed conduit having a first end attached to said carrier gas supply conduit and a second end attached to said process gas delivery conduit;
    wherein said feed conduit is positioned so that said first end is at a higher elevation than said second end.

28. A method as in claim 27, wherein said cleaning fluid is stirred just prior to said step of supplying said cleaning fluit.

29. A method as in claim 27, further comprising the step of measuring an amount of material accumulated in said process gas delivery conduit using an optical sensor.

30. A method as in claim 27, further comprising the step of heating at least a portion of said process gas delivery conduit after supplying cleaning fluid to vaporize any fluid remaining in said conduit.

31. A method for controlling thte cleaning cycle in a process gas delivery system comprising the steps of:
    providing a carrier gas supply conduit leading into a bubbler, said bubbler containing a deposition precursor material;
    providing a process gas delivery conduit leading from said bubbler to a process chamber;
    providing a supply of cleaning fluid;
    providing a feed conduit having a first end attached to said carrier conduit and a second end attached to said process gas delivery conduit, wherein said first end of said feed conduit is positioned at a higher elevation than said second end of said feed conduit;
    measuring an amount of material accumulated within said process gas delivery conduit using a sensor disposed along said process gas delivery conduit; and
    automatically supplying a cleaning fluid to said feed conduit when said amount of material accumulated within said process gas delivery conduit reaches a predetermined level.

32. A gas distribution system comprising:
    a carrier gas source;
    a container housing a liquid deposition precursor material from which a process gas is formed, said liquid deposition precursor material filling a portion of said container;
    a first conduit for carrying said carrier gas to said container, said first conduit having an open end in said container, said open end being positioned within said liquid deposition precursor material in said container;
    a second conduit for carrying said process gas to said process chamber, said second conduit connected to said container and positioned to receive said carrier gas and said process gas after said carrier gas has flowed through said liquid deposition precursor material;
    a first valve disposed between said container and said process chamber;
    a second valve disposed between said carrier gas supply and said container;
    a cleaning solution supply;
    a cleaning solution conduit for supplying cleaning solution to said first conduit; and
    a sensor disposed along said second conduit for detecting an amount of material accumulated within said second conduit.

33. A gas distribution system as in claim 32, further comprising a feed conduit having first and second ends and a third valve between said first and second ends for transporting said cleaning solution from said first conduit to said second conduit, said first end being connected to said first conduit and said second end being connected to said second conduit.

34. A self-cleaning gas delivery system for a processing reactor, comprising:
    a carrier gas supply for containing a carrier gas;
    a bubbler for containing a deposition precursor material;
    a carrier gas supply conduit connecting said carrier gas supply and said bubbler;
    a process gas delivery conduit delivering processing gas from said bubbler to said processing reactor;
    a cross-feed conduit having a first end attached to said carrier gas supply conduit at a first elevation and a second end attached said process gas delivery conduit at a second elevation lower than said first elevation;
    a sensor disposed along said process gas delivery conduit for measuring an amount of material accumulated within said process gas delivery;
    a cleaning fluid source for containing a cleaning fluid; and
    valves responsive to said sensor for supplying said cleaning fluid from said cleaning fluid source to said cross-feed conduit.

* * * * *